(12) United States Patent
Kitajo

(10) Patent No.: US 10,854,475 B2
(45) Date of Patent: Dec. 1, 2020

(54) WIRING SUBSTRATE

(71) Applicant: SHINKO ELECTRIC INDUSTRIES CO., LTD., Nagano (JP)

(72) Inventor: Natsuko Kitajo, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/211,716

(22) Filed: Dec. 6, 2018

(65) Prior Publication Data

US 2019/0198433 A1    Jun. 27, 2019

(30) Foreign Application Priority Data

Dec. 27, 2017   (JP) ................. 2017-250751

(51) Int. Cl.
*H01L 21/48* (2006.01)
*H01L 23/498* (2006.01)

(52) U.S. Cl.
CPC .... *H01L 21/4857* (2013.01); *H01L 23/49838* (2013.01); *H01L 23/49894* (2013.01); *H05K 2201/09781* (2013.01)

(58) Field of Classification Search
CPC ............... H05K 2201/09781; H01L 23/49838
See application file for complete search history.

(56) References Cited

U.S. PATENT DOCUMENTS

| 5,760,885 A * | 6/1998 | Yokoyama | ............ G01S 7/484 |
| | | | 356/4.01 |
| 2018/0025991 A1* | 1/2018 | Koketsu | ............ H01L 23/5226 |
| | | | 257/368 |

FOREIGN PATENT DOCUMENTS

JP     2007-062175     3/2007

* cited by examiner

*Primary Examiner* — Amar Movva
(74) *Attorney, Agent, or Firm* — IPUSA, PLLC

(57) ABSTRACT

A wiring substrate includes: a first insulating layer; a plurality of wiring patterns formed on one surface of the first insulating layer; a dummy pattern formed, on the one surface of the first insulating layer, between the nearby wiring patterns; and a second insulating layer made of resin and formed on the one surface of the first insulating layer so as to cover the nearby wiring patterns and the dummy pattern, wherein the dummy pattern is a dot pattern arranged at a center portion between the nearby wiring patterns, and wherein a height of at least one dot constituting the dummy pattern is lower than heights of the nearby wiring patterns.

5 Claims, 11 Drawing Sheets

WIRING SUBSTRATE

CROSS-REFERENCE TO RELATED APPLICATION

This application is based upon and claims priority to Japanese Patent Application No. 2017-250751, filed on Dec. 27, 2017, the entire contents of which are incorporated herein by reference.

FIELD

The embodiments discussed herein relate to a wiring substrate.

BACKGROUND

A wiring substrate in which an insulating layer and a wiring layer are alternately stacked is known in the related art. When manufacturing such a wiring substrate, for example, a wiring layer is formed on a first insulating layer, a resin film that covers the wiring layer is further laminated on the first insulating layer, and the resin film is hardened to form a second insulating layer.

Here, when the space between nearby wiring patterns constituting a wiring layer is wide (for example, approximately 400 μm), there may be a case in which the resin film softened at the time of lamination deforms downward and traps bubbles, and due to the trapped air bubbles, a void occurs in the second insulating layer.

RELATED-ART DOCUMENT

Patent Document

[Patent Document 1] Japanese Laid-open Patent Publication No. 2007-62175

Because a void is a factor of a decrease in insulation resistance between a wiring layer and another wiring layer, for example, the occurrence of a void is undesirable.

SUMMARY

According to an aspect of the embodiments, a wiring substrate includes: a first insulating layer; a plurality of wiring patterns formed on one surface of the first insulating layer; a dummy pattern formed, on the one surface of the first insulating layer, between the nearby wiring patterns; and a second insulating layer made of resin and foamed on the one surface of the first insulating layer so as to cover the nearby wiring patterns and the dummy pattern, wherein the dummy pattern is a dot pattern arranged at a center portion between the nearby wiring patterns, and wherein a height of at least one dot constituting the dummy pattern is lower than heights of the nearby wiring patterns.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
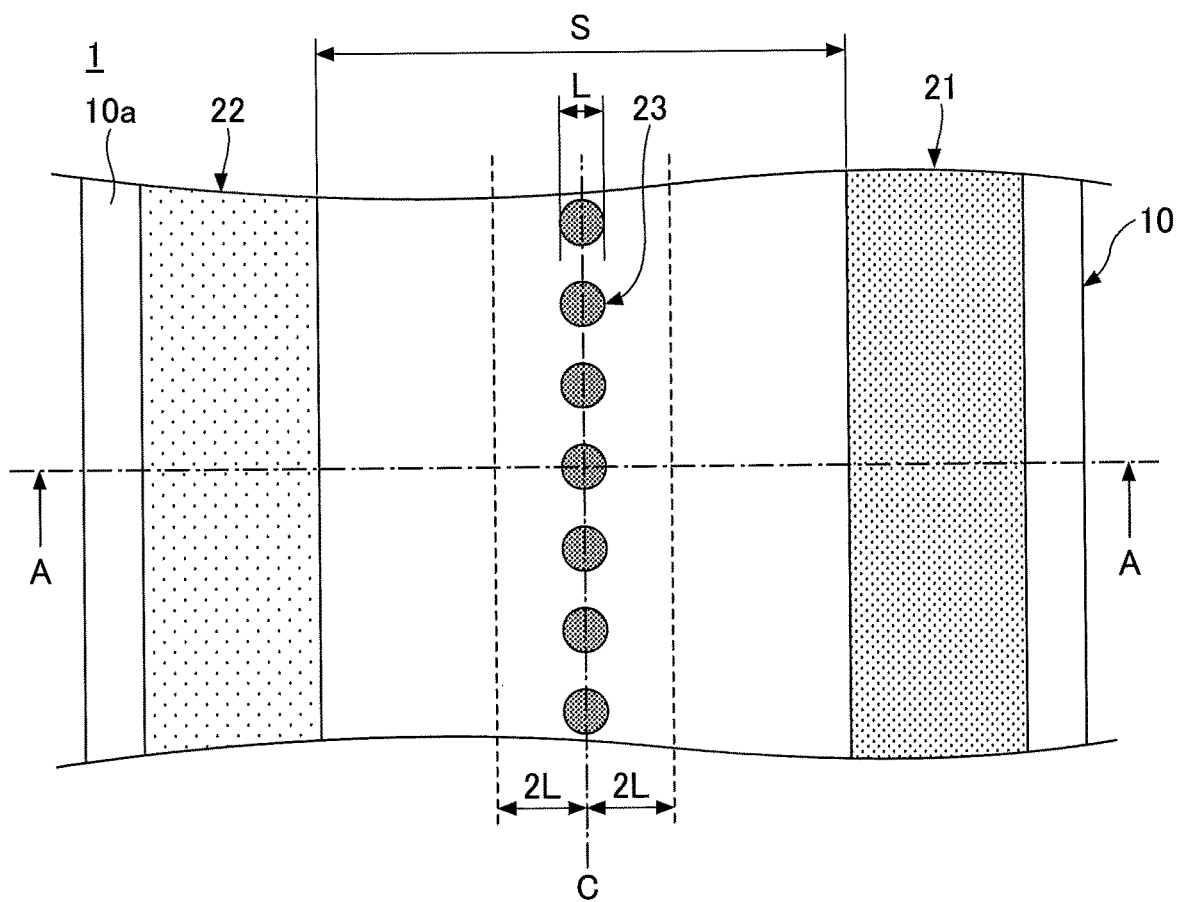
FIGS. 1A and 1B are diagrams illustrating an example of a wiring substrate according to a first embodiment.

In the following, an embodiment will be described with reference to the accompanying drawings. In these drawings, the same elements are referred to by the same reference numerals, and duplicate descriptions may be omitted as appropriate.

First Embodiment

[Structure of Wiring Substrate According to First Embodiment]

Figure 1B:
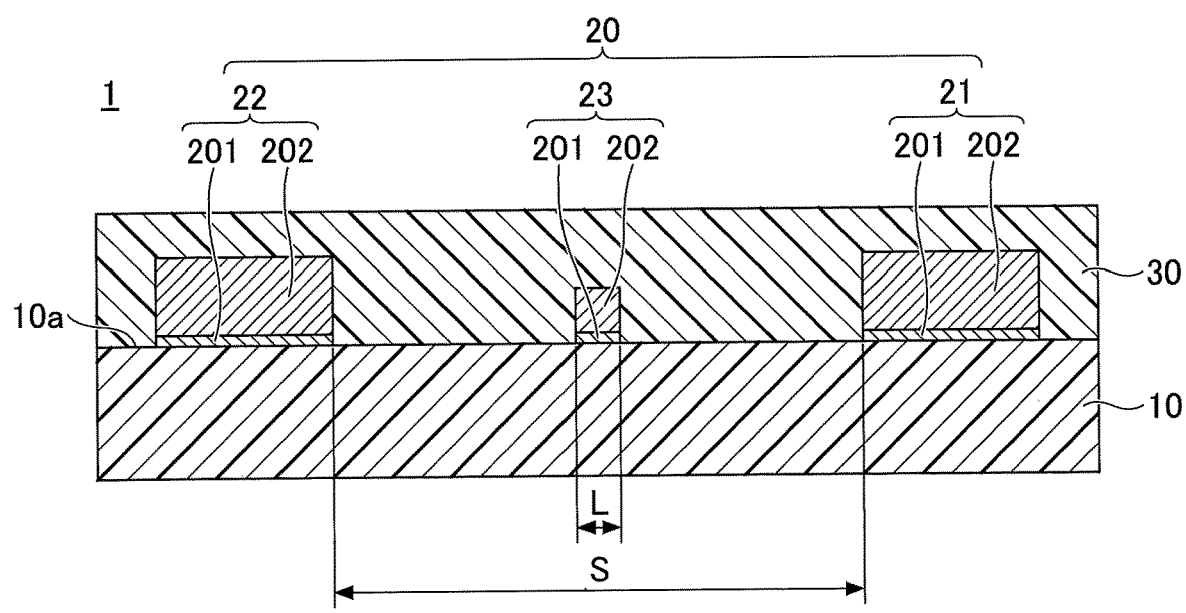

First, a structure of a wiring substrate 1 according to a first embodiment will be described. FIGS. 1A and 1B are diagrams illustrating an example of the wiring substrate 1 according to the first embodiment. FIG. 1A is a partial plan view of the wiring substrate 1, and FIG. 1B is a cross-sectional view of the wiring substrate 1 taken along the line A-A of FIG. 1A. Note that in FIG. 1A, wiring patterns 21 and 22 and a dummy pattern 23 are illustrated by pear-skin patterns for convenience of description. Also, in FIG. 1A, illustration of an insulating layer 30 that is illustrated in FIG. 1B is omitted.

With reference to FIGS. 1A and 1B, the wiring substrate 1 includes an insulating layer 10, a wiring layer 20, and the insulating layer 30.

Note that according to the first embodiment, for convenience of description, the insulating layer 30 side of the wiring substrate 1 is referred to as an upper side or one side, and the insulating layer 10 side of the wiring substrate 1 is referred to as a lower side or the other side. Also, with respect to each part or element of the wiring substrate 1, an insulating layer 30 side surface is referred to as one surface or an upper surface, and an insulating layer 10 side surface is referred to as the other surface or a lower surface. Note that the wiring substrate 1, however, may be used in an inverted position or may be oriented at a desired angle. Also, a plan view refers to a view of an object taken in a direction normal to one surface 10a of the insulating layer 10, and a planar shape refers to the shape of an object viewed in a direction normal to the one surface 10a of the insulating layer 10.

The insulating layer 10 is a layer that is a base on which the wiring layer 20 and the like are formed. As a material of the insulating layer 10, for example, a thermosetting insulating resin whose main component is an epoxy resin, an imide resin, a phenolic resin, a cyanate resin or the like can be used. The thermosetting insulating resin used as the insulating layer 10 may be a non-photosensitive insulating resin or may be a photosensitive insulating resin. Also, the insulating layer 10 may include a reinforcing member made of a nonwoven fabric or a woven fabric such as glass fiber or aramid fiber. Also, the insulating layer 10 may include a filler such as silica ($SiO_2$). The thickness of the insulating layer 10 may be, for example, in a range of approximately 10 µm to approximately 50 µm.

The wiring layer 20 is formed on the one surface 10a of the insulating layer 10. The wiring layer 20 includes the wiring pattern 21, the wiring pattern 22, and the dummy pattern 23. Note that although the wiring patterns 21 and 22 and the dummy patterns 23 in the wiring layer 20 are denoted by different reference numerals for convenience of description, the wiring patterns 21 and 22 and the dummy patterns 23 can be formed by a same process using a same material. The wiring patterns 21 and 22 and the dummy pattern 23 can be structured such that electrolytic plating layers 202 are stacked on a seed layer 201. As a material of the seed layer 201, for example, copper (Cu) or the like can be used. As a material of the electrolytic plating layers 202, for example, copper (Cu) or the like can be used.

The insulating layer 30 is an insulating layer made of resin and is formed on the one surface 10a of the insulating layer 10 so as to cover the wiring layer 20. The material and the thickness of the insulating layer 30 may be, for example, similar to those of the insulating layer 10. The insulating layer 30 may include a filler such as silica ($SiO_2$).

In the following, the wiring layer 20 will be described in detail. The wiring pattern 21 and the wiring pattern 22 are arranged with a space S (wiring space) therebetween. However, the space S may be constant or may be changed depending on places. The widths of the wiring patterns 21 and 22 can be determined as desired. One or both of the wiring patterns 21 and 22 may be a solid pattern.

The dummy pattern 23 is a dot pattern. Here, the dot pattern is a pattern in which a plurality of dots is arranged independently so as not to be in contact with each other. According to the first embodiment, for example, the dummy pattern 23 is a pattern in which a plurality of cylindrical dots are arranged in a line at the center portion between nearby wiring patterns 21 and 22.

Here, the center portion between the nearby wiring patterns 21 and 22 refers to an area, with respect to the center line C (the center of the space S) passing through the center between the side surfaces of the wiring pattern 21 and the wiring pattern 22 facing each other, within ±2 L in the directions towards the side surfaces of the wiring pattern 21 and the wiring pattern 22 facing each other in plan view. When the dots have a cylindrical shape, L is a diameter. When the dots have an elliptical shape, L is a short diameter. When the dots have a circular truncated cone shape, L is a diameter of the bottom surface. When the dots have another shape, L is a width in the short direction of the dots constituting the dummy pattern.

Here, L can be in a range of approximately 2.5% to approximately 5% of the space S between the side surfaces of the wiring pattern 21 and the wiring pattern 22 facing each other. For example, when the space S is 400 µm, L can be in a range of approximately 10 µm to approximately 20 µm.

The heights of the respective cylindrical dots constituting the dummy pattern 23 are lower than the heights of the nearby wiring patterns 21 and 22. The heights of the wiring patterns 21 and 22 can be, for example, in a range of approximately 10 µm to approximately 20 µm. The heights of the respective cylindrical dots constituting the dummy pattern 23 can be, for example, approximately half of the heights of the wiring patterns 21 and 22.

[Method of Manufacturing Wiring Substrate According to First Embodiment]

Figure 2A:
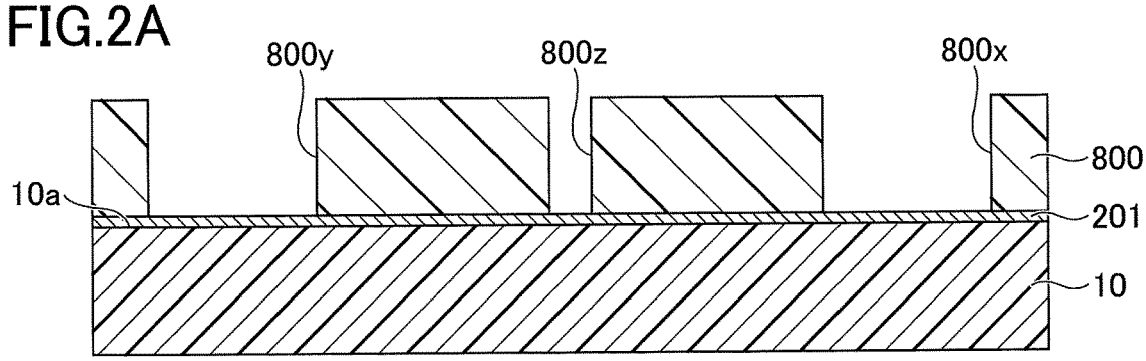
FIGS. 2A to 2D are diagrams illustrating an example of manufacturing steps of the wiring substrate according to the first embodiment.
Figure 2B:
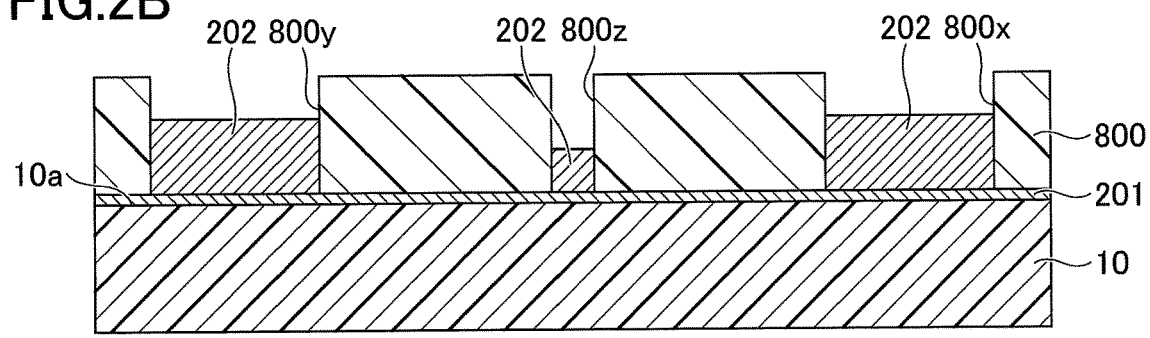
Figure 2C:
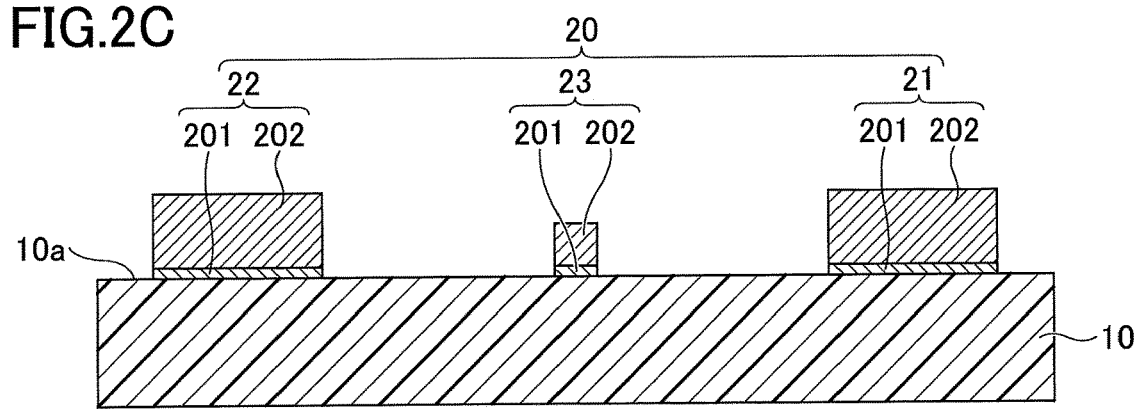

Next, a method of manufacturing the wiring substrate 1 according to the first embodiment will be described. FIGS. 2A to 2C are diagrams illustrating an example of the steps of manufacturing the wiring substrate 1 according to the first embodiment. Note that although an example of the steps of manufacturing a single wiring substrate is described in the first embodiment, after manufacturing a plurality of portions to be wiring substrates, the respective portions may be isolated as the plurality of wiring substrates.

First, in the step illustrated in FIG. 2A, by a sputtering method or an electroless plating method, a seed layer 201 that continuously covers the one surface 10a of the insulating layer 10 is formed using copper (Cu) or the like. The thickness of the seed layer 201 is in a range of approximately 0.1 µm to approximately 1 µm. Next, a photosensitive resist is coated or laminated on the seed layer 201 to be exposed to light and developed. A resist layer 800 having an opening 800x corresponding to the wiring pattern 21, an opening 800y corresponding to the wiring pattern 22, and an opening 800z corresponding to the dummy pattern 23 is formed.

Next, in the step illustrated in FIG. 2B, by an electrolytic plating method using the seed layer 201 as a power supply layer, electrolytic plating layers 202 are formed on the seed layer 201, exposing in the opening 800x, in the opening 800y, and in the opening 800z of the resist layer 800, using copper (Cu) or the like.

Here, the openings 800x and 800y have wide widths. Therefore, in the case of copper plating, for example, copper ions are easily supplied to the openings 800x and 800y and the deposition rate of the plating is high. Thus, the electrolytic plating layers 202 in the openings 800x and 800y are formed to be relatively thick. Conversely, because the width of the opening 800z is narrower than those of the openings 800x and 800y, copper ions are not easily supplied and the deposition rate of the plating is low. Thus, the electrolytic plating layer 202 in the opening 800z is thinner than the electrolytic plating layers 202 in the openings 800x and 800y.

In this manner, by adjusting the sizes of the opening portions where the electrolytic plating layers 202 are formed, it is possible to form the electrolytic plating layers 202 having different heights by the same plating process. Also, by changing the width of the opening 800z, the height of the electrolytic plating layer 202 formed in the opening 800z can be adjusted.

Next, in the step illustrated in FIG. 2C, after removing the resist layer 800, portions of the seed layer 201 not covered with the electrolytic plating layers 202 are removed by etching with the electrolytic plating layers 202 as masks. Thus, the wiring layer 20 (the wiring patterns 21 and 22 and the dummy pattern 23) in which the electrolytic plating layers 202 are stacked on the seed layer 201 is formed. Note that because the upper surface and the side surface of each of the electrolytic plating layers 202 are also etched when the seed layer 201 is etched, the size (width and height) of each of the electrolytic plating layers 202 becomes somewhat smaller than that in the step illustrated in FIG. 2B.

Figure 2D:
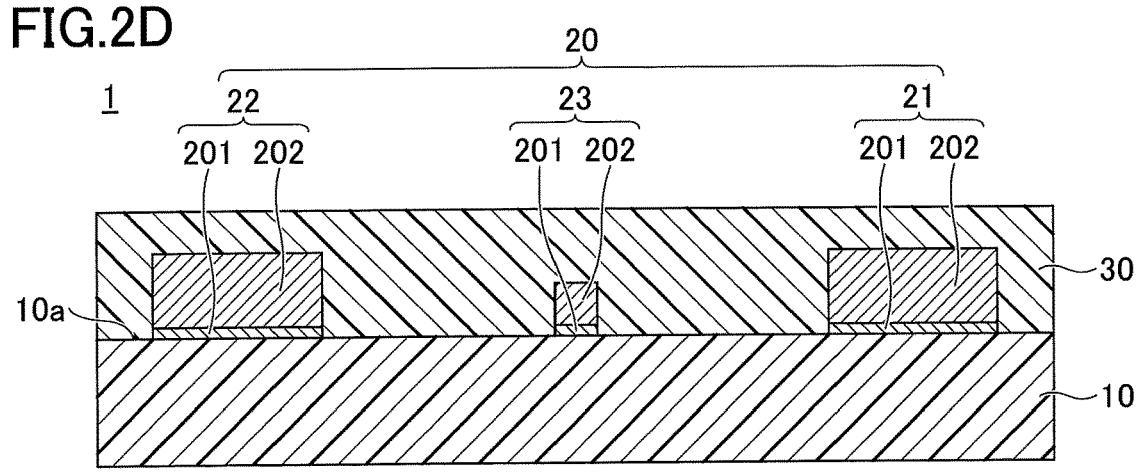

Next, in the step illustrated in FIG. 2D, an insulating layer 30 made of resin that covers the wiring layer 20 is formed on one surface 10a of the insulating layer 10. Specifically, for example, on the one surface 10a of the insulating layer 10, an insulating resin film in a semi-hardened state is laminated in a vacuum so as to cover the wiring layer 20. Thereafter, while applying pressure to the insulating resin film, the insulating resin film is heated to harden the insulating resin film such that the insulating layer 30 is famed. Through the above described steps, the wiring substrate 1 is completed.

Here, effects of the wiring substrate 1 including the dummy pattern 23 will be described with reference to a comparative example.

Figure 3A:
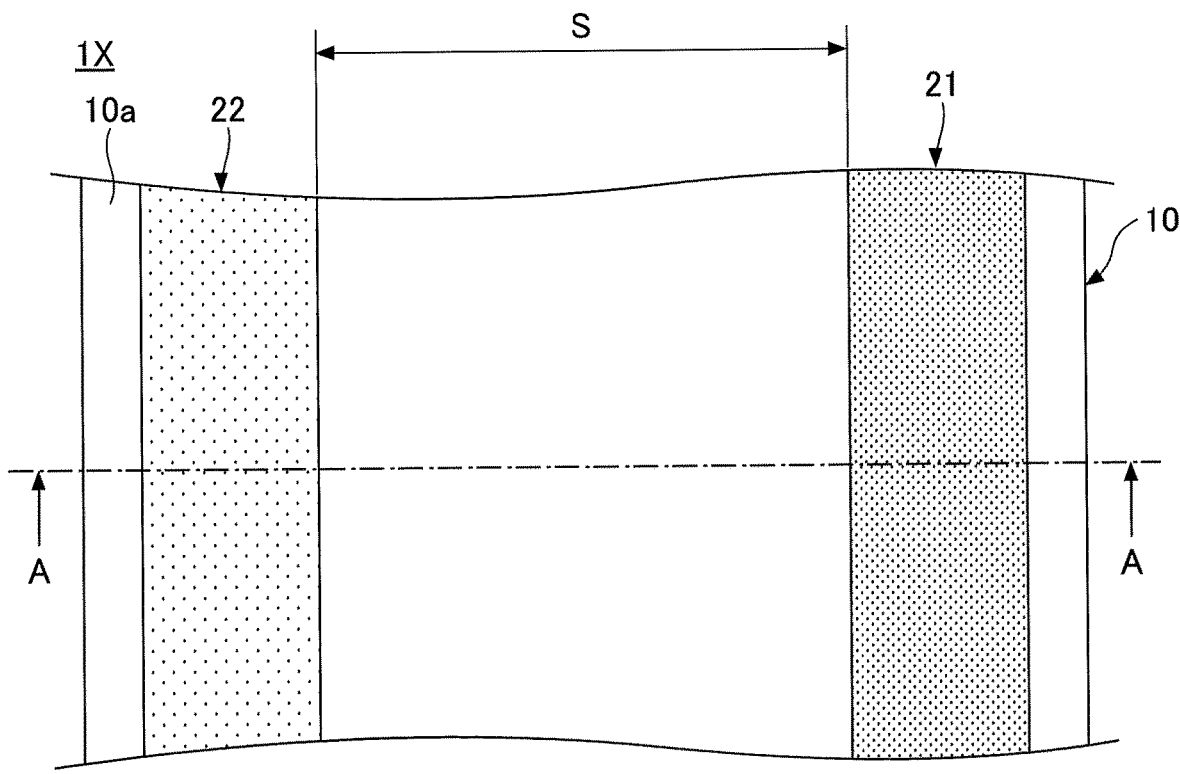
FIGS. 3A and 3B are diagrams illustrating an example of a wiring substrate according to a comparative example.
Figure 3B:
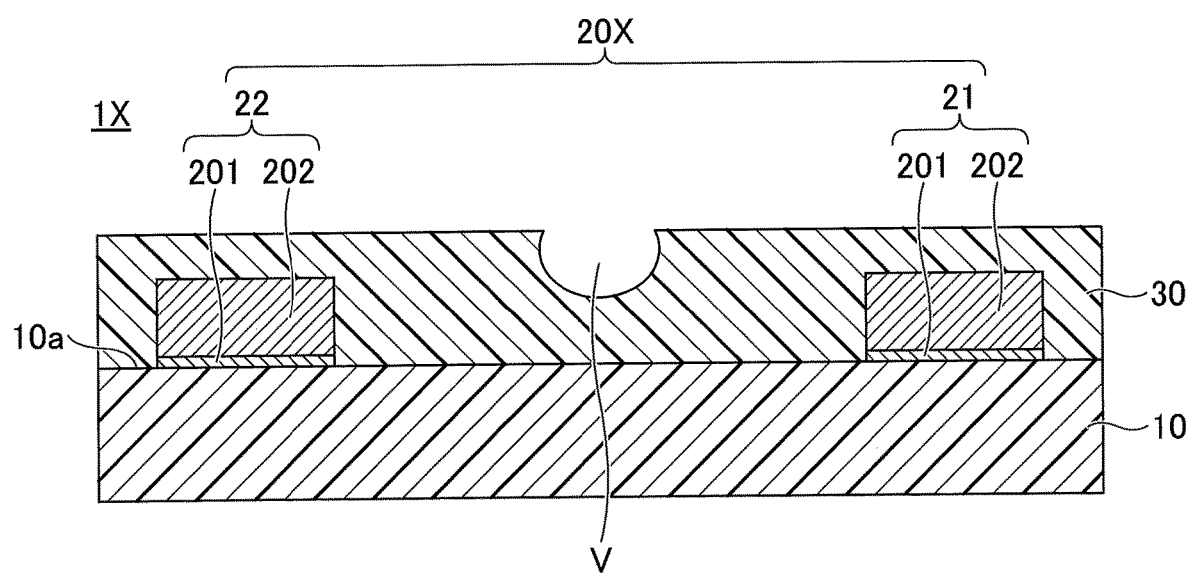

FIGS. 3A and 3B are diagrams illustrating an example of a wiring substrate 1X according to the comparative example. FIG. 3A is a partial plan view of the wiring substrate 1X, and FIG. 3B is a cross-sectional view of the wiring substrate 1X taken along the line A-A of FIG. 3A. Note that in FIG. 3A, the wiring patterns 21 and 22 are illustrated by pear-skin patterns for convenience of description. Also, in FIG. 3A, illustration of the insulating layer 30 that is illustrated in FIG. 3B is omitted.

With reference to FIGS. 3A and 3B, the wiring substrate 1X is different from the wiring substrate 1 (see FIG. 1 and the like) in that a wiring layer 20X including the wiring patterns 21 and 22 without a dummy pattern 23 is formed. In the wiring substrate 1X, a void V is formed in the insulating layer 30. Note that the void V is not intentionally formed, but is unintentionally formed in the manufacturing steps of the wiring substrate 1X.

FIGS. 4 and 5 are diagrams illustrating an example of a part of the manufacturing steps of the wiring substrate 1X according to the comparative example. First, similarly to the wiring substrate 1 according to the first embodiment, the wiring patterns 21 and 22 are formed on one surface 10a of the insulating layer 10. Next, as illustrated in FIGS. 4 and 5, the insulating layer 30 is formed on the one surface 10a of the insulating layer 10.

Figure 4A:
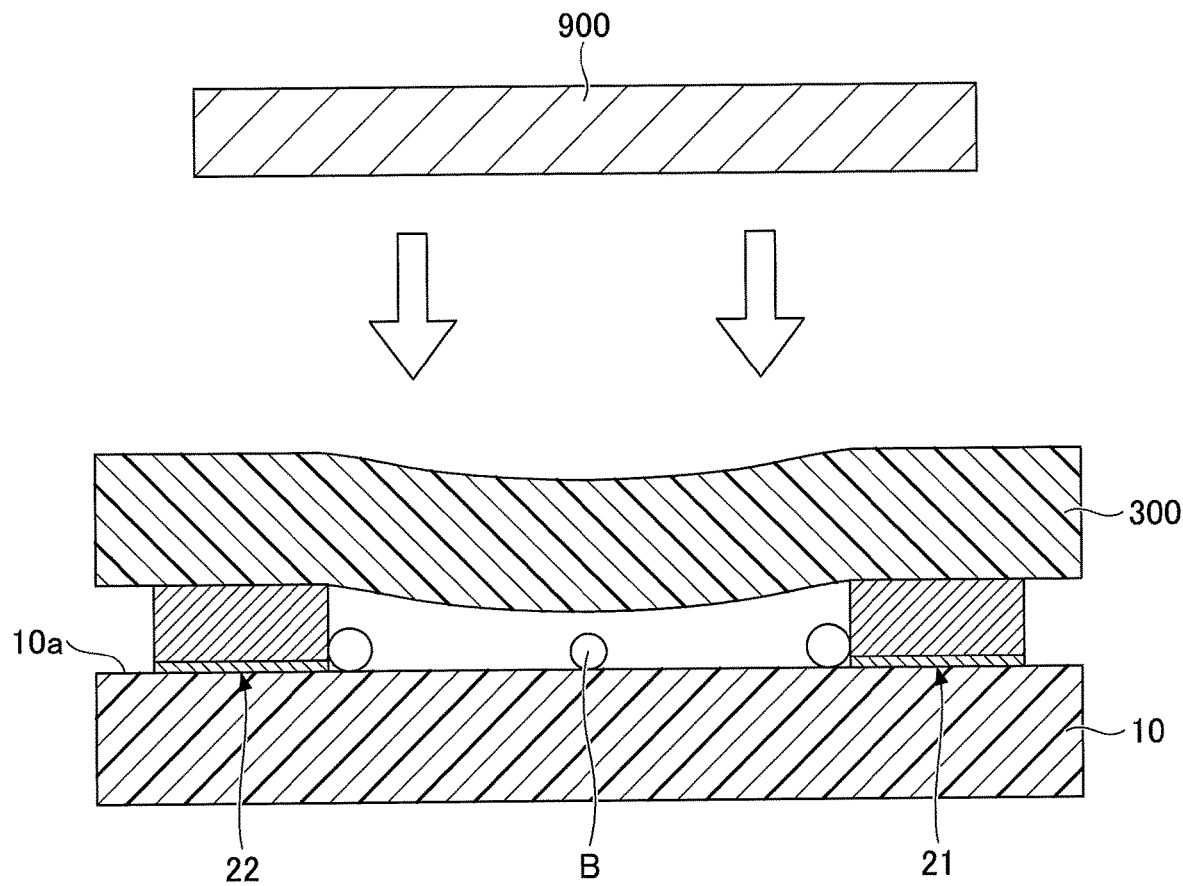
FIGS. 4A and 4B are diagrams illustrating an example of a part of manufacturing steps of the wiring substrate according to the comparative example (part 1)

In order to form the insulating layer 30, first, in the step illustrated in FIG. 4A, the insulating layer 10 on which the wiring patterns 21 and 22 are formed is arranged below a pressure thermal plate 900 in a vacuum. Further, an insulating resin film 300 (which becomes the insulating layer 30 upon being hardened) is arranged on the wiring patterns 21 and 22. At this time, due to radiant heat from the pressure thermal plate 900 indicated by the arrows, the resin film 300 is heated and softened, and the resin film 300 deforms downwardly and develops tackiness. Note that "B" indicated by "○" in FIG. 4A indicate places where spaces easily remain (this also applies to the following drawings).

Figure 4B:
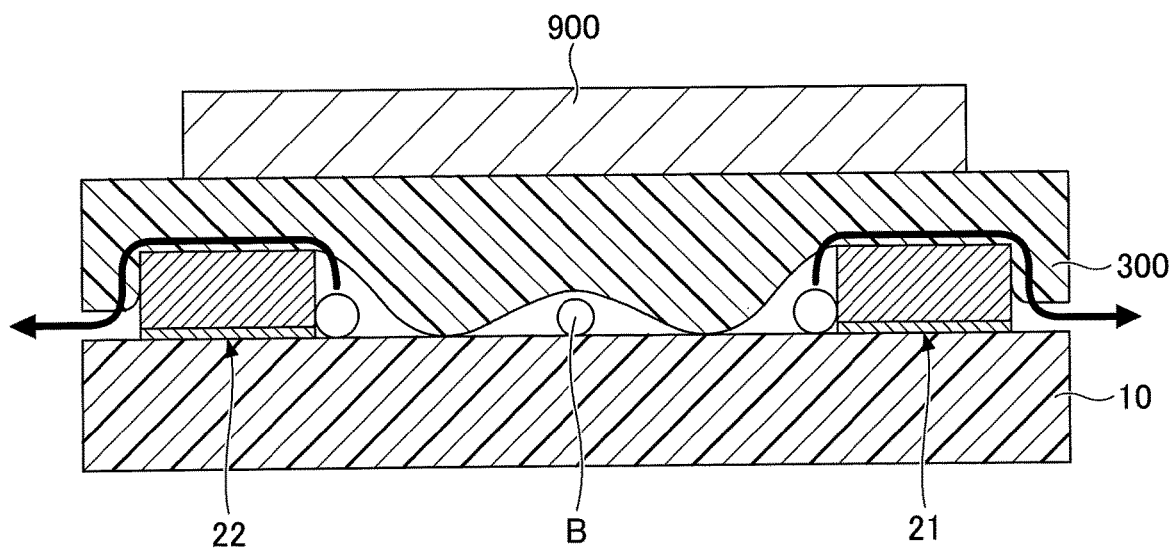

Next, in the step illustrated in FIG. 4B, the pressure thermal plate 900 is lowered to press the resin film 300 while heating the resin film 300. At this time, by depressurization (vacuuming), even at spaces close to the end portions of the wiring patterns 21 and 22 where air bubbles easily occur, because air is exhausted to the outside through the interfaces between the wiring patterns 21 and 22 and the resin film 300 as indicted by the arrows in FIG. 4B, bubbles are not trapped in the resin film 300.

Conversely, when the space between the wiring pattern 21 and the wiring pattern 22 is wide (for example, approximately 400 μm), the resin film 300 deforms downward from the end portions of the wiring patterns 21 and 22 such that, while leaving an inside space, the resin film 300 contacts the one surface 10a of the insulating layer 10 between the wiring pattern 21 and the wiring pattern 22. Because the resin film 300 develops tackiness, the space that is present near the center between the wiring pattern 21 and the wiring pattern 22 is trapped in the resin film 300 as air bubbles.

That is, because the distances to the outside are short, the spaces close to the end portions of the wiring patterns 21 and 22 are easily depressurized, no space remains, and bubbles do not occur. Conversely, the portion where the resin film 300 and the one surface 10a of the insulating layer 10 are in contact with each other has a long distance to the outside and is not easily depressurized. Therefore, before being depressurized, the drawing port is closed due to tackiness, and the remaining space is trapped in the resin film 300 as air bubbles.

Figure 5A:
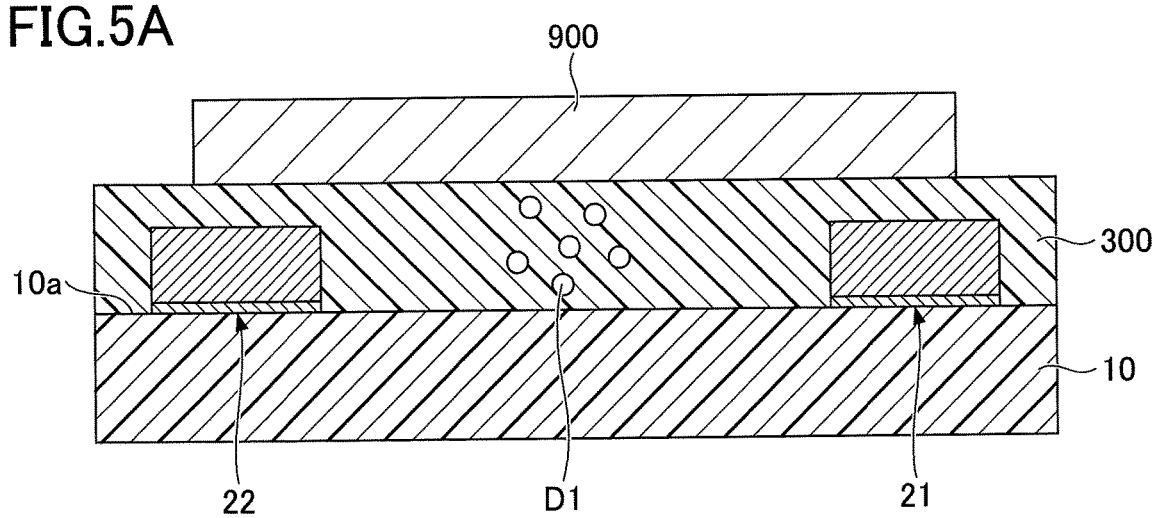
FIGS. 5A to 5C are diagrams illustrating an example of a part of the manufacturing steps of the wiring substrate according to the comparative example (part 2)

Next, in the step illustrated in FIG. 5A, the pressure thermal plate 900 is further lowered to press the resin film 300 while heating the resin film 300. As a result, the air bubbles trapped by the resin film 300 are dispersed small in the resin film 300 to become air bubbles D1.

Figure 5B:
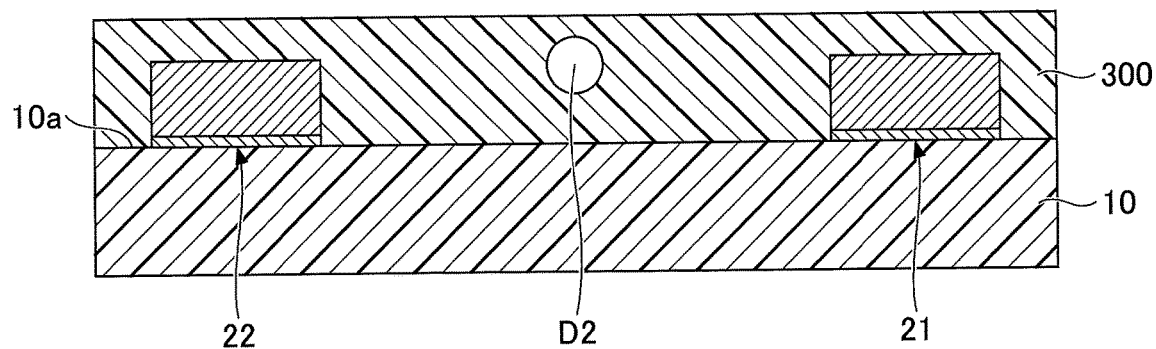

Next, in the step illustrated in FIG. 5B, the resin film 300 is heated in a state where the resin film 300 is not pressed. At this time, the small air bubbles D1 dispersed in the resin film 300 are agglomerated by being heated, and become a large bubble D2.

Figure 5C:
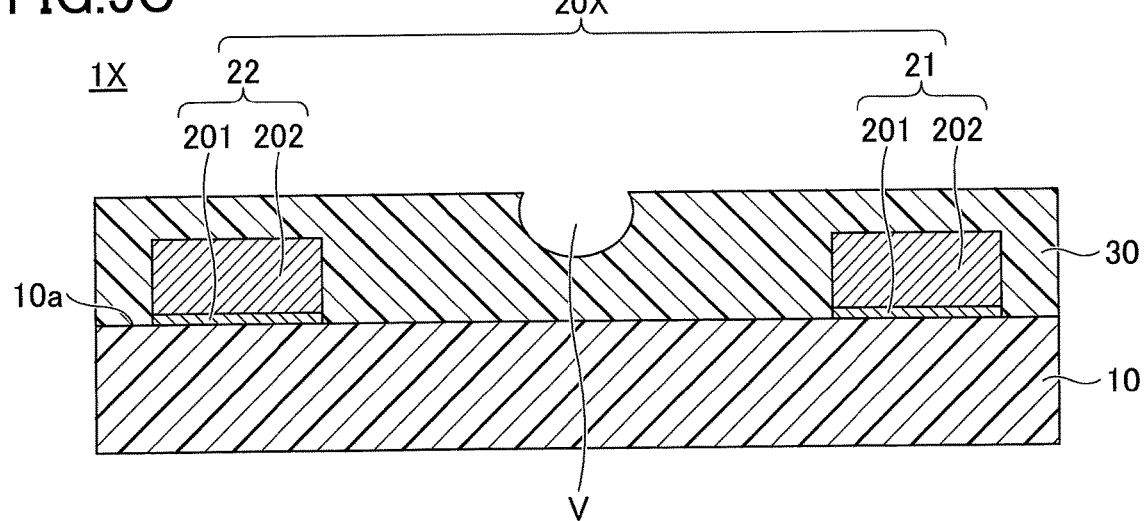

Next, in the step illustrated in FIG. 5C, the resin film 300 is further heated to be a temperature greater than or equal to a curing temperature (hardening temperature) in a state where the resin film 300 is not pressed. As a result, the resin film 300 is hardened to form the insulating layer 30. At this time, during hardening of the resin film 300, the aggregated large bubble D2 volumetrically expands and explodes. Thus, a depression occurs in the insulating layer 30 and the void V occurs.

As described above, because a dummy pattern 23 is not formed in the wiring substrate 1X, there may be a case in which a void occurs in the insulating layer 30 in the step of forming the insulating layer 30 by lamination. In particular, in a case in which the space between the wiring pattern 21 and the wiring pattern 22 is wide, a void is likely to occur.

Figure 6A:
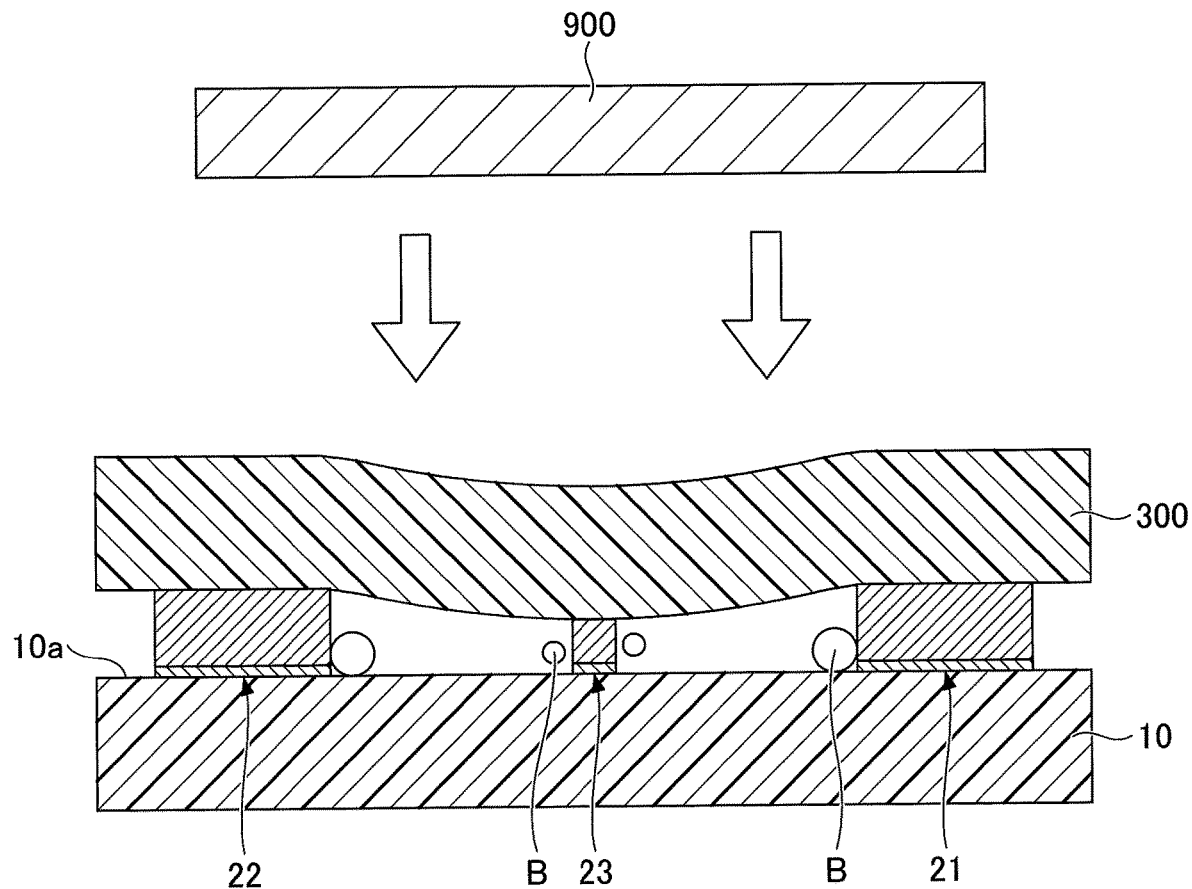
FIGS. 6A and 6B are diagrams that describe effects of a dummy pattern.

With respect to the above, as illustrated in FIG. 6A, in a case where the dummy pattern 23 is formed between the wiring pattern 21 and the wiring pattern 22, even when the resin film 300 deforms downward, the resin film 300 contacts the dummy pattern 23 before the one surface 10a of the insulating layer 10. The dummy pattern 23 is a dot pattern, and spaces are present between nearby dots. Thus, even when the resin film 300 contacts the dummy pattern 23, because air flows through the spaces between the dots, the flow of air at the time of depressurization is not hindered.

Figure 6B:
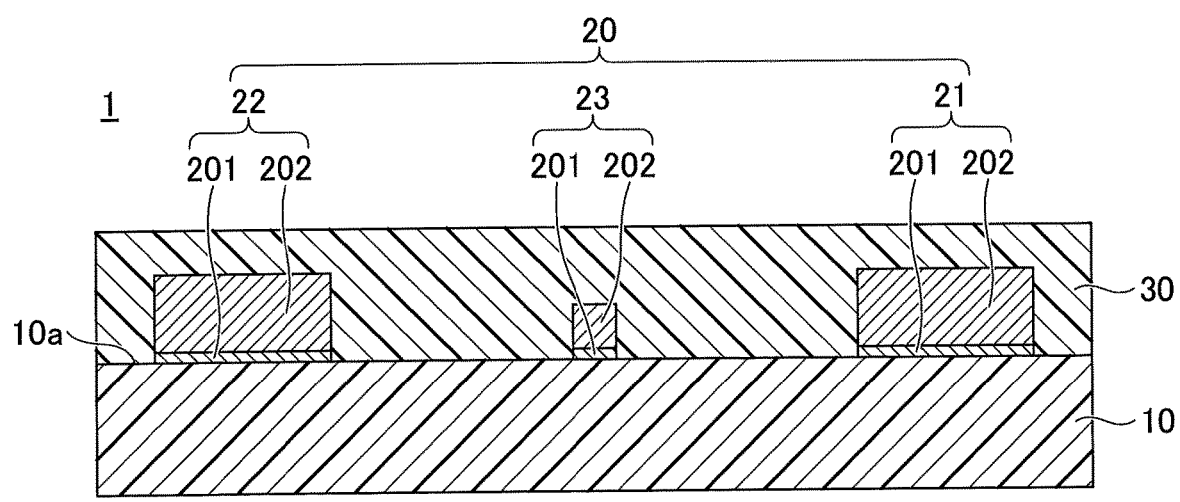

Therefore, by depressurization after the state illustrated in FIG. 6A, air is entirely exhausted to the outside without leaving any space in the resin film 300, and air bubbles do not remain between the resin film 300 and the one surface 10a of the insulating layer 10. As a result, by executing steps similar to those illustrated in FIGS. 4B to 5C, it is possible to obtain the insulating layer 30, in which a void is not generated, as illustrated in FIG. 6B.

Note that downward deformation of the resin film 300 between the wiring patterns 21 and 22 and the dummy pattern 23 is slight, and between the wiring patterns 21 and 22 and the dummy pattern 23, the resin film 300 does not contact the one surface 10a of the insulating layer 10.

Thus, by forming the dummy pattern 23, which is a dot pattern, between the wiring pattern 21 and the wiring pattern 22, it is possible to avoid a situation, in which the resin film 300 deforms downward and comes into contact with the one surface 10a of the insulating layer 10 and the resin film 300 involves a space. As a result, an occurrence of a void can be suppressed, a decrease in insulation resistance between the wiring layer 20 and another wiring layer and short circuit between the wiring layer 20 and another wiring layer can be prevented, and the production yield rate of the wiring board 1 can be enhanced.

Also, even when the resin film 300 contacts the one surface 10a of the insulating layer 10 due to downward deformation of the resin film 300 between the wiring patterns 21 and 22 and the dummy pattern 23, an occurrence of a void can be suppressed by reducing the height of the dummy pattern 23 to be lower than the heights of the wiring patterns 21 and 22 as will be described later below.

Also, by making the dummy pattern 23 with a plurality of arranged dots, it is possible to deal with downward deformation of the resin film 300 whose occurrence place and occurrence time cannot be identified, and it is possible to further reduce the possibility of an occurrence of a void.

Figure 7A:
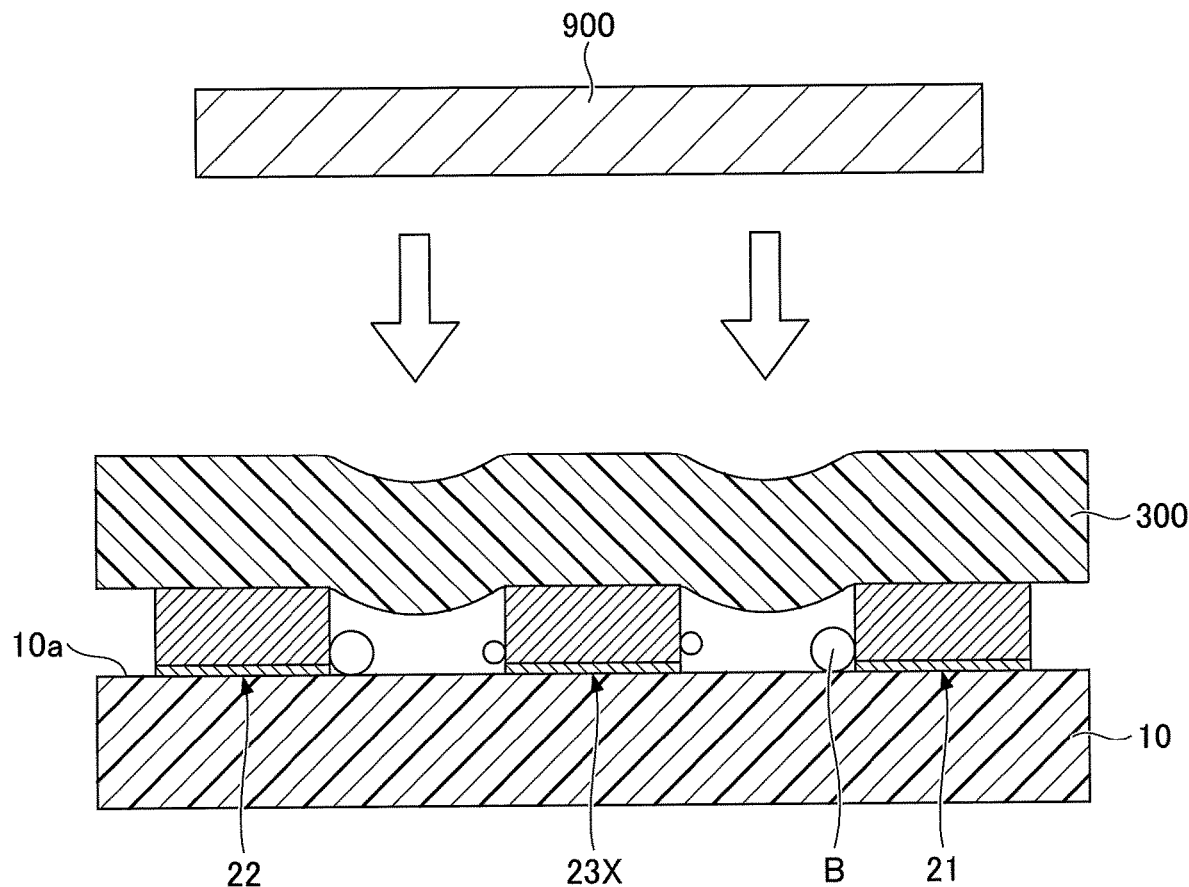
FIGS. 7A and 7B are diagrams that describe another comparative example.

Here, as illustrated in FIG. 7A, it may be considered to form, between the wiring pattern 21 and the wiring pattern 22, one continuous dummy pattern 23X having a height the same as the heights of the wiring patterns 21 and 22. In this case, it is also possible to avoid a situation in which the resin film 300 deforms downward and contacts the one surface 10a of the insulating layer 10.

Figure 7B:
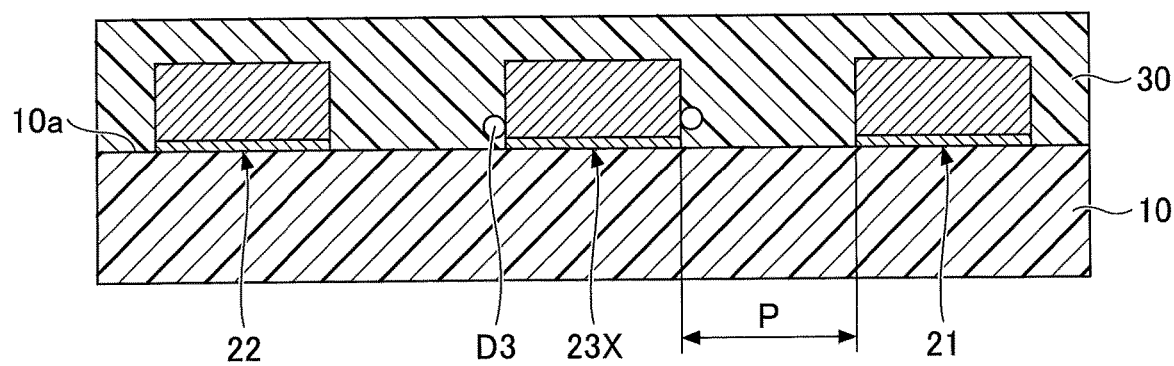

However, because the height of the dummy pattern 23X is the same as the heights of the wiring patterns 21 and 22, if the resin film 300 deforms downward between the wiring patterns 21 and 22 and the dummy pattern 23 such that the resin film 300 comes into contact with the one surface 10a of the insulating layer 10, a space formed by the side surface of the dummy pattern 23X, the resin film 300, and the one surface 10a of the insulating layer 10 becomes very large. Also, as illustrated in FIG. 7B, because the distance from the lower surface of the resin film 300 deforming downward is long, the space near the side surface of the dummy pattern 23X does not easily move even when being depressurized, and the resin cannot be replaced and bubbles D3 remain. As a result, a large bubble occurs in the insulating layer 30, and a void occurs.

Conversely, according to the wiring substrate 1, because the heights of the respective dots constituting the dummy pattern 23 are made lower than the heights of the nearby wiring patterns 21 and 22, unlike the case of FIGS. 7A and 7B, the following effects can be obtained.

That is, it is possible to keep the volume of a space formed by the side surface of the dummy pattern 23, the resin film 300, and the one surface 10a of the insulating layer 10 as small as possible. Thus, even when the resin film 300 contacts the one surface 10a of the insulating layer 10 due to downward deformation of the resin film 300 between the wiring patterns 21 and 22 and the dummy pattern 23, the space formed by the side surface of the dummy pattern 23, the resin film 300, and the one surface 10a of the insulating layer 10 is kept small. As a result, the possibility of occurrence of a void in the insulating layer 30 can be reduced, or even if a void occurs, the size of the void can be kept small.

Further, by making the heights of the respective dots constituting the dummy pattern 23 lower than the heights of the nearby wiring patterns 21 and 22 and by keeping the area of the dummy pattern 23 in plan view as small as possible, the following first and second effects can be obtained.

First, because it makes it easy to fill between the dummy pattern 23 and the wiring pattern 21 and between the dummy pattern 23 and the wiring pattern 22 with resin, lamination is not hindered.

Second, the distance between the dummy pattern 23 and the wiring pattern 21 and the distance between the dummy pattern 23 and the wiring pattern 22 can be made longer than the distance P illustrated in FIG. 7B. In other words, the width of the dummy pattern 23 occupying the space S between the nearby wiring patterns 21 and 22 can be narrowed. This makes it possible to suppress an occurrence of electromigration.

Note that although the dots constituting the dummy pattern 23 have cylindrical shapes in the wiring substrate 1 described above, the shapes of the dots are not limited to the cylindrical shapes, and as will be described later below, the dots may have shapes such as elliptical cylindrical shapes, circular truncated cone shapes, or prism shapes. Also, the shapes such as elliptical cylindrical shapes, circular truncated cone shapes, and prism shapes here may include a shape whose corner part is rounded or whose upper surface has a curved surface shape.

Variation Example 1 of First Embodiment

As variation example 1 of the first embodiment, an example of a wiring substrate including a dummy pattern different from that of the first embodiment will be described. Note that in variation example 1 of the first embodiment, descriptions of constituent elements that are the same as those of the first embodiment previously described may be omitted as appropriate.

Figure 8A:
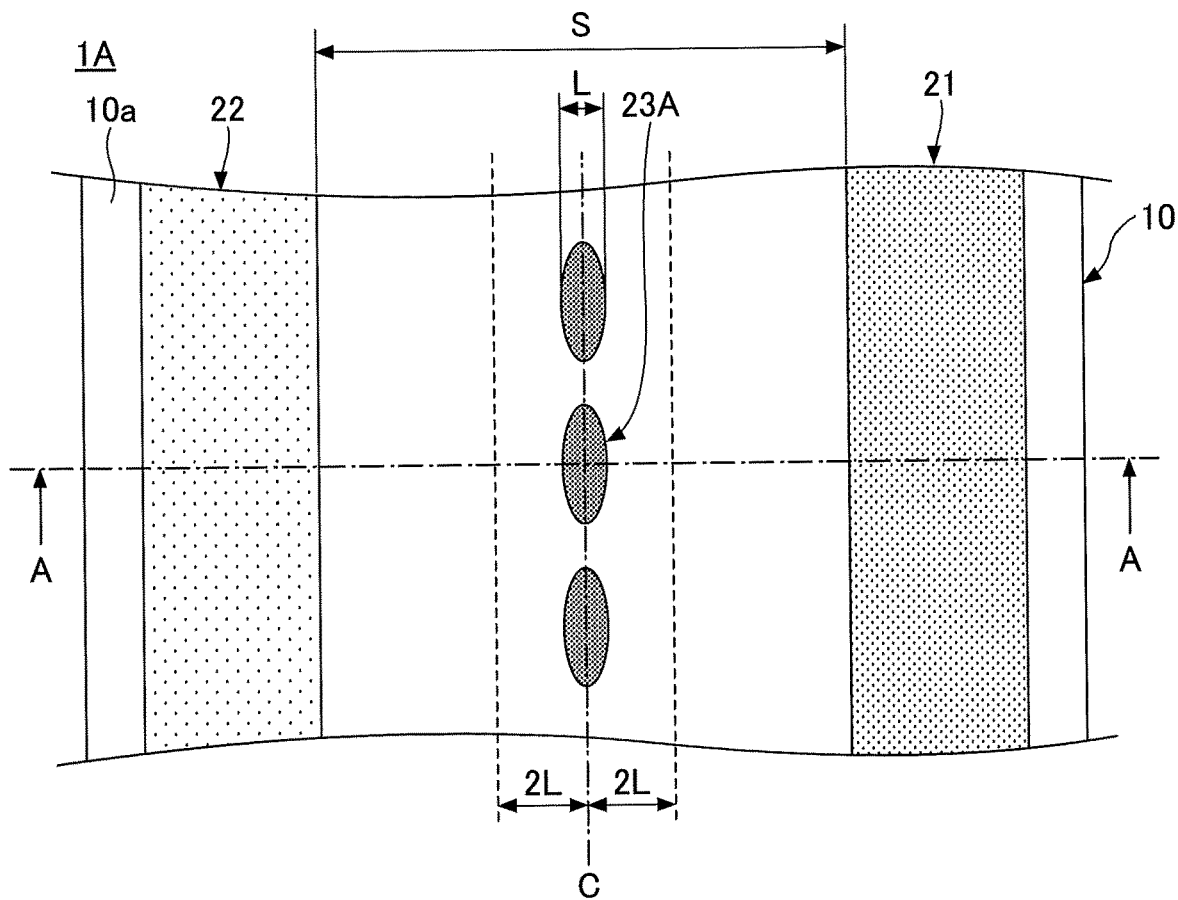
FIGS. 8A and 8B are diagrams illustrating an example of a wiring substrate according to variation example 1 of the first embodiment.
Figure 8B:
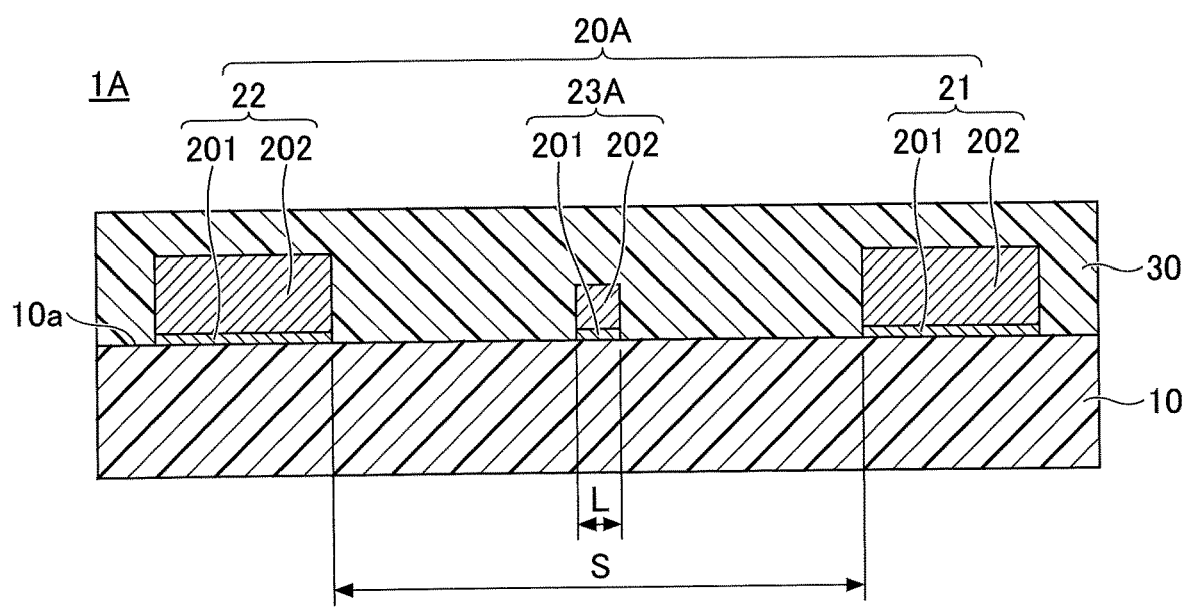

FIGS. 8A and 8B are diagrams illustrating an example of a wiring substrate 1A according to variation example 1 of the first embodiment. FIG. 8A is a partial plan view of the wiring substrate 1A, and FIG. 8B is a cross-sectional view of the wiring substrate 1A taken along the line A-A of FIG. 8A. Note that in FIG. 81A, the wiring patterns 21 and 22 and a dummy pattern 23A are illustrated by pear-skin patterns for convenience of description. Also, in FIG. 8A, illustration of the insulating layer 30 that is illustrated in FIG. 8B is omitted.

With reference to FIGS. 8A and 8B, the wiring substrate 1A is different from the wiring substrate 1 (see FIG. 1 and the like) in that the wiring layer 20 is replaced with a wiring layer 20A including the wiring patterns 21 and 22 and the dummy pattern 23A.

According to variation example 1 of the first embodiment, for example, the dummy pattern 23A is a pattern in which a plurality of dots, each of which has an elliptical cylindrical shape and has a shorter diameter L, are arranged in a line at the center portion between the nearby wiring patterns 21 and 22 such that the longitudinal directions of the dots are oriented in the arranging direction of the dots.

Similarly to the first embodiment, L can be in a range of approximately 2.5% to approximately 5% of the space S (wiring space) between the side surfaces of the wiring pattern 21 and the wiring pattern 22 facing each other. For example, when the space S is 400 μm, L can be in a range of approximately 10 μm to approximately 20 μm.

Similarly to the first embodiment, the heights of the respective elliptical-cylinder-shaped dots constituting the dummy pattern 23A are lower than the heights of the nearby wiring patterns 21 and 22. The heights of the wiring patterns 21 and 22 can be, for example, in a range of approximately 10 μm to approximately 20 μm. The heights of the respective elliptical-cylinder-shaped dots constituting the dummy pattern 23A can be, for example, approximately half of the heights of the wiring patterns 21 and 22.

In this manner, even when the dots constituting the dummy pattern 23A have elliptical cylindrical shapes, effects similar to those of the first embodiment can be obtained.

However, it is not preferable to arrange a plurality of dots each of which has an elliptical cylindrical shape with a short diameter L such that the short side directions of the dots are oriented in the arranging direction of the dots. This is because this arrangement widens the width of the dummy pattern 23A occupying the space S between the nearby wiring patterns 21 and 22 and the effect of suppressing an occurrence of electromigration is decreased.

Variation Example 2 of First Embodiment

As variation example 2 of the first embodiment, another example of a wiring substrate including a dummy pattern different from that of the first embodiment will be described. Note that in variation example 2 of the first embodiment, descriptions of constituent elements that are the same as those of the first embodiment previously described may be omitted as appropriate.

Figure 9A:
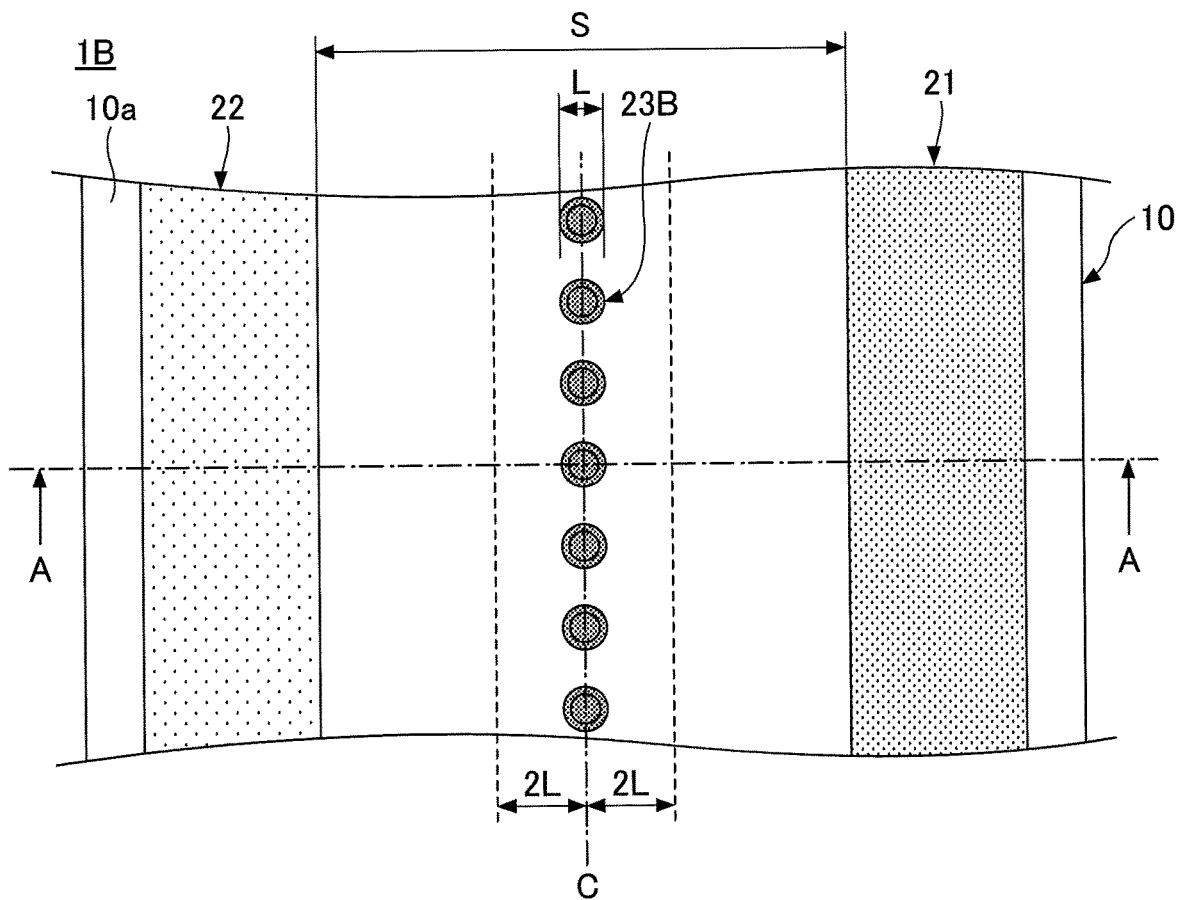
FIGS. 9A and 9B are diagrams illustrating an example of a wiring substrate 1B according to variation example 2 of the first embodiment.
Figure 9B:
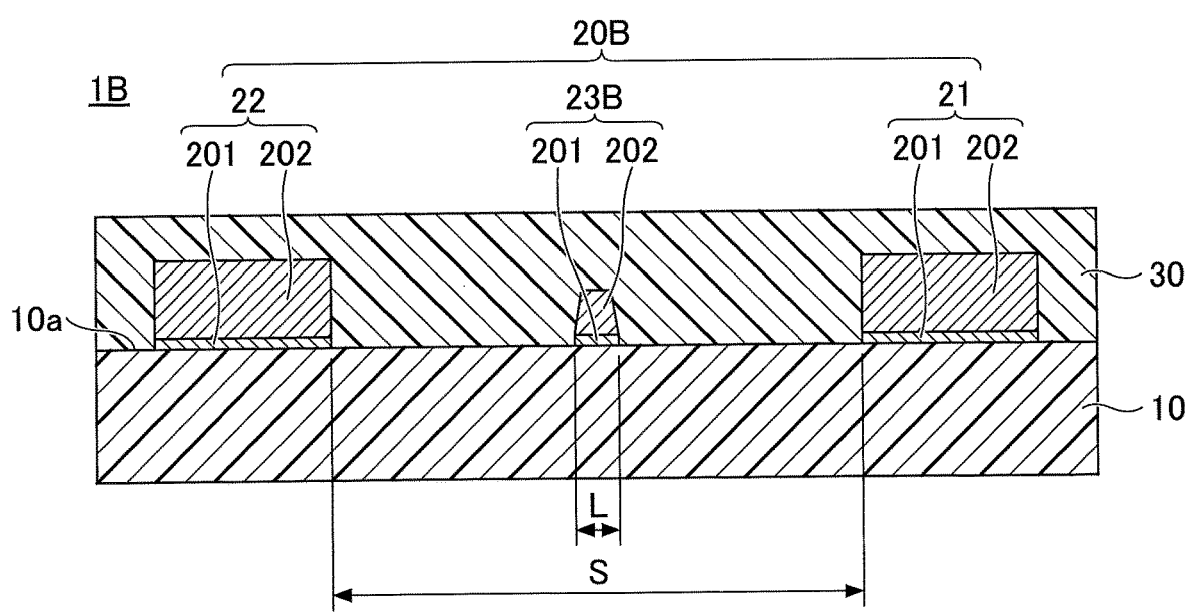

FIGS. 9A and 9B are diagrams illustrating an example of a wiring substrate 1B according to variation example 2 of the first embodiment. FIG. 9A is a partial plan view of the wiring substrate 1B, and FIG. 9B is a cross-sectional view of the wiring substrate 1B taken along the line A-A of FIG. 9A. Note that in FIG. 9A, the wiring patterns 21 and 22 and a dummy pattern 23B are illustrated by pear-skin patterns for convenience of description. Also, in FIG. 9A, illustration of the insulating layer 30 that is illustrated in FIG. 9B is omitted.

With reference to FIGS. 9A and 9B, the wiring substrate 1B is different from the wiring substrate 1 (see FIG. 1 and the like) in that the wiring layer 20 is replaced with a wiring layer 20B including the wiring patterns 21 and 22 and the dummy pattern 23B.

According to variation example 2 of the first embodiment, for example, the dummy pattern 23B is a pattern in which a plurality of dots, each of which has a circular truncated cone shape and has a diameter L at the bottom surface, are arranged in a line at the center portion between the nearby wiring patterns 21 and 22.

Similarly to the first embodiment, L can be in a range of approximately 2.5% to approximately 5% of the space S (wiring space) between the side surfaces of the wiring pattern 21 and the wiring pattern 22 facing each other. For example, when the space S is 400 μm, L can be in a range of approximately 10 μm to approximately 20 μm.

Similarly to the first embodiment, the heights of the respective circular-truncated-cone-shaped dots constituting the dummy pattern 23B are lower than the heights of the nearby wiring patterns 21 and 22. The heights of the wiring patterns 21 and 22 can be, for example, in a range of approximately 10 μm to approximately 20 μm. The heights of the respective circular-truncated-cone-shaped dots constituting the dummy pattern 23B can be, for example, approximately half of the heights of the wiring patterns 21 and 22.

In order to form circular-truncated-cone-shaped dots, the etching amount (etching time) may be increased when unnecessary portions of the seed layer 201 are removed by etching in the step illustrated in FIG. 2C. In this case, when etching the seed layer 201, at a corner portion that is a boundary between the upper surface and the side surface of each dot of the dummy pattern 23B, etching is performed from both the upper surface side and the side surface side. Therefore, as the etching amount (etching time) is increased, the corner portion side of each dot becomes thinner, and it is possible to form dots each of which has a circular truncated cone shape and widens toward the bottom surface. Note that the lower the height of each dot, the thinner the corner portion side of each dot and the stronger the tendency to widen toward the bottom.

In this manner, by making the dots constituting the dummy pattern 23B into circular truncated cone shapes, in addition to the effects of the first embodiment, the following effects can be further obtained.

That is, because each dot constituting the dummy pattern 23B has an inclined side surface that widens toward the bottom surface (widens toward the one surface 10a of the insulating layer 10), air bubbles near the side surfaces of the dots at the time of depressurization easily move along the one surface 10a of the insulating layer 10. Therefore, air bubbles can be more easily exhausted to the outside, and traps of air bubbles can be further reduced.

Also, even when the resin film 300 contacts the one surface 10a of the insulating layer 10 due to downward deformation of the resin film 300 between the wiring patterns 21 and 22 and the dummy pattern 23B, the space formed by the side surface of the dummy pattern 23B, the resin film 300, and the one surface 10a of the insulating layer 10 can be made smaller than that of Example 1. As a result, the possibility of occurrence of a void in the insulating layer 30 can be reduced, or even if a void occurs, the size of the void can be kept small.

Also, because each dot constituting the dummy pattern 23B has an inclined side surface that widens toward the bottom surface, resin filling property at the time of lamination can be enhanced. As a result, it makes it further easy to fill between the dummy pattern 23B and the wiring pattern 21 and between the dummy pattern 23B and the wiring pattern 22 with resin.

Note that the effects described above can be obtained when each dot constituting the dummy pattern 23B has an inclined side surface that widens toward the bottom surface. Accordingly, the shape of each dot constituting the dummy pattern 23B is not limited to a circular truncated cone shape, and can be any shape having an inclined side surfaces that widens toward the bottom surface.

Variation Example 3 of First Embodiment

As variation example 3 of the first embodiment, another example of a wiring substrate including a dummy pattern different from that of the first embodiment will be described. Note that in variation example 3 of the first embodiment, descriptions of constituent elements that are the same as those of the first embodiment previously described may be omitted as appropriate.

Figure 10A:
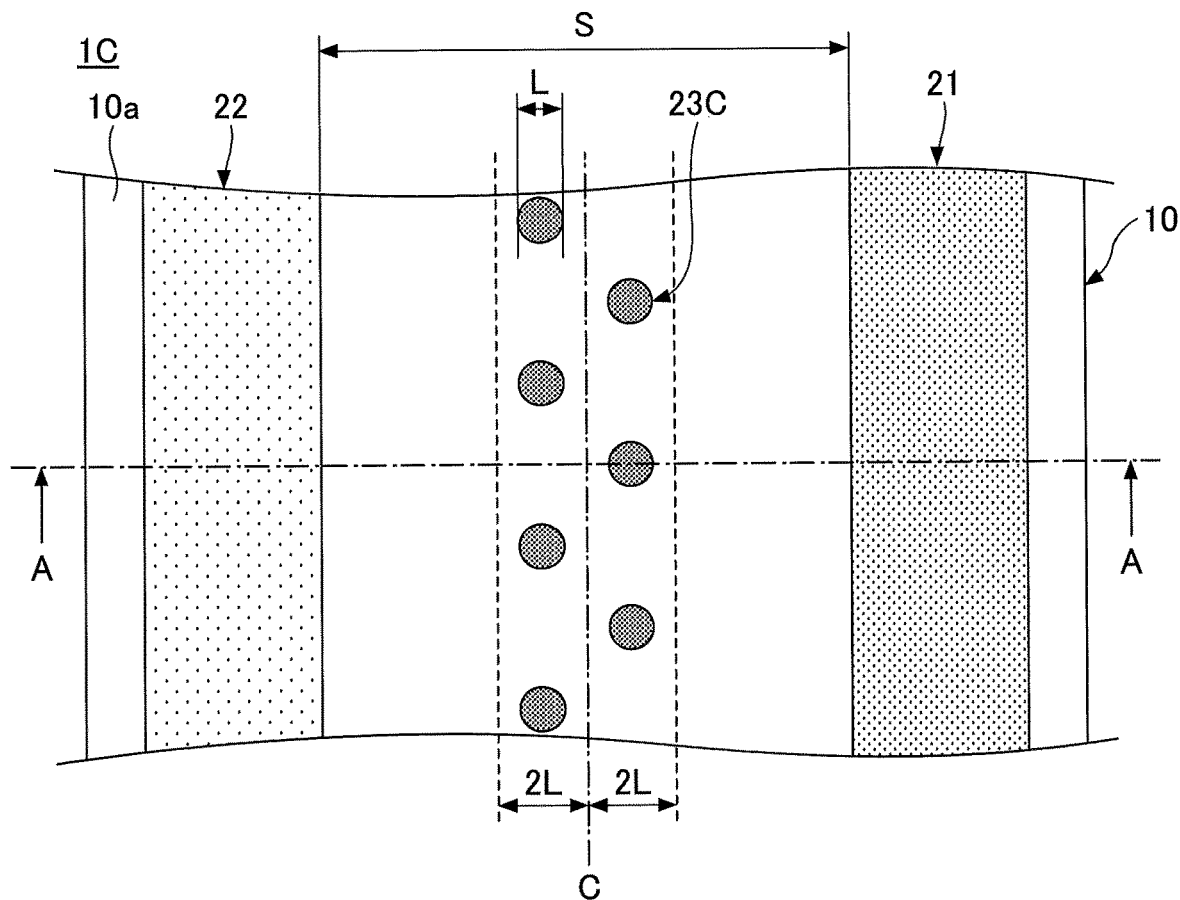
FIGS. 10A and 10B are diagrams illustrating an example of a wiring substrate according to variation example 3 of the first embodiment.
Figure 10B:
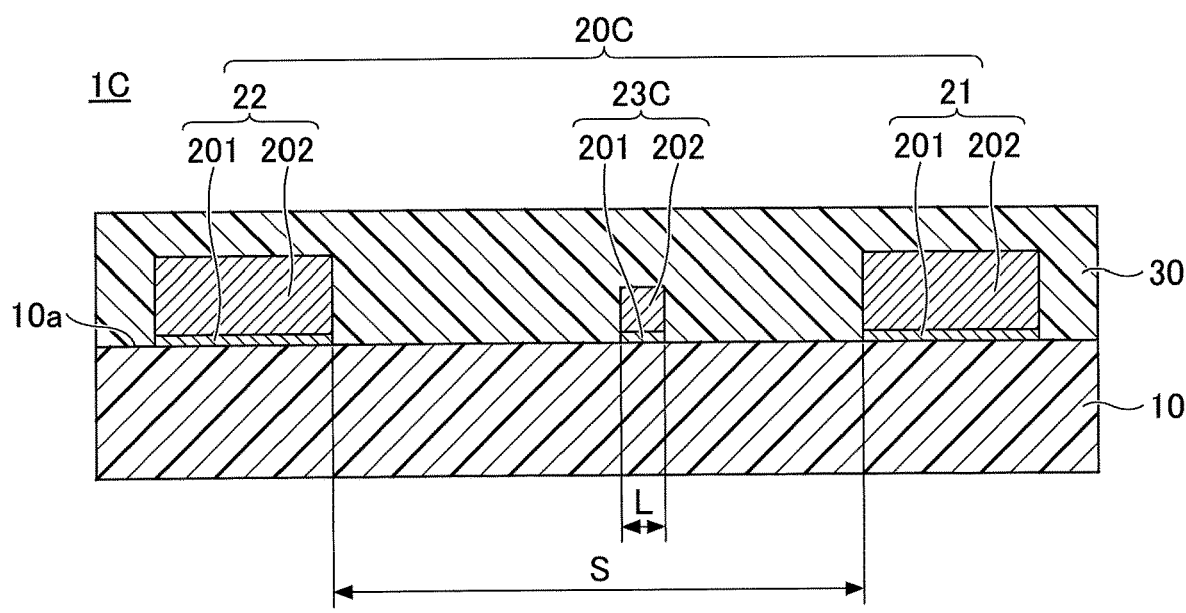

FIGS. 10A and 10B are diagrams illustrating an example of a wiring substrate 10 according to variation example 3 of the first embodiment. FIG. 10A is a partial plan view of the wiring substrate 10, and FIG. 10B is a cross-sectional view of the wiring substrate 10 taken along the line A-A of FIG. 10A. Note that in FIG. 10A, the wiring patterns 21 and 22 are illustrated and a dummy pattern 23C by pear-skin patterns for convenience of description. Also, in FIG. 10A, illustration of the insulating layer 30 that is illustrated in FIG. 10B is omitted.

With reference to FIGS. 10A and 10B, the wiring substrate 10 is different from the wiring substrate 1 (see FIG. 1 and the like) in that the wiring layer 20 is replaced with a wiring layer 20C including the wiring patterns 21 and 22 and the dummy pattern 23C.

According to variation example 3 of the first embodiment, for example, the dummy pattern 23C is a pattern in which a plurality of cylindrical dots are arranged in a zigzag manner at the center portion between the nearby wiring patterns 21 and 22.

Similarly to the first embodiment, L can be in a range of approximately 2.5% to approximately 5% of the space S (wiring space) between the side surfaces of the wiring pattern 21 and the wiring pattern 22 facing each other. For example, when the space S is 400 µm, L can be in a range of approximately 10 µm to approximately 20 µm.

Similarly to the first embodiment, the heights of the respective cylindrical dots constituting the dummy pattern 23C are lower than the heights of the nearby wiring patterns 21 and 22. The heights of the wiring patterns 21 and 22 can be, for example, in a range of approximately 10 µm to approximately 20 µm. The heights of the respective cylindrical dots constituting the dummy pattern 23C can be, for example, approximately half of the heights of the wiring patterns 21 and 22.

In this way, arranging the dots constituting the dummy pattern 23C in a zigzag manner makes it easy to deal with downward deformation of the resin film 300. That is, even when the resin film 300 deforms downward toward any part, the possibility that any of the dots receive the downward deformation of the resin film 300 can be enhanced.

Note that the effects described above can be obtained when the dots constituting the dummy pattern 23C are arranged in a zigzag manner. Therefore, the shapes of the dots constituting the dummy pattern 23C are not limited to cylindrical shapes, and can be shapes as desired.

Variation Example 4 of First Embodiment

As variation example 4 of the first embodiment, another example of a wiring substrate including a dummy pattern different from that of the first embodiment will be described. Note that in variation example 4 of the first embodiment, descriptions of constituent elements that are the same as those of the first embodiment previously described may be omitted as appropriate.

Figure 11A:
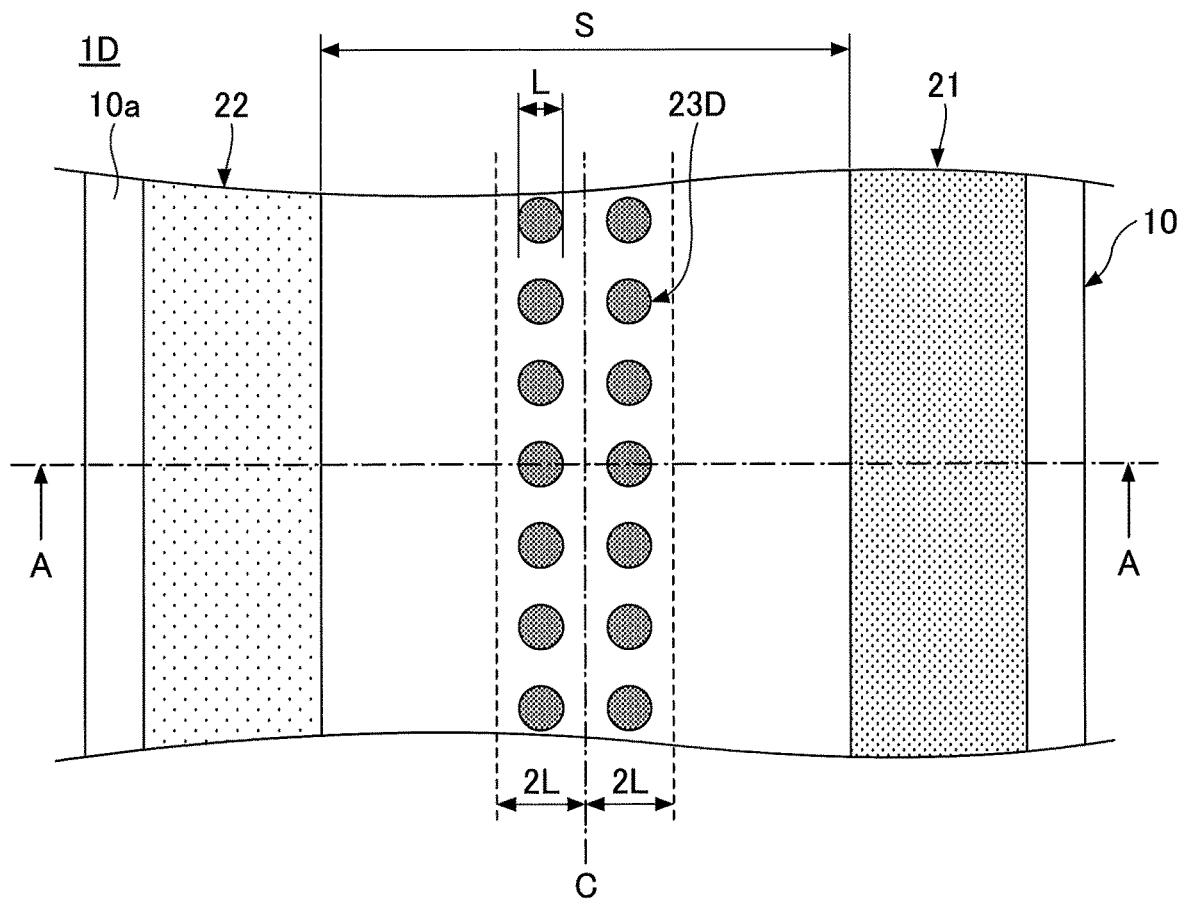
FIGS. 11A and 11B are diagrams illustrating an example of a wiring substrate according to variation example 4 of the first embodiment.
Figure 11B:
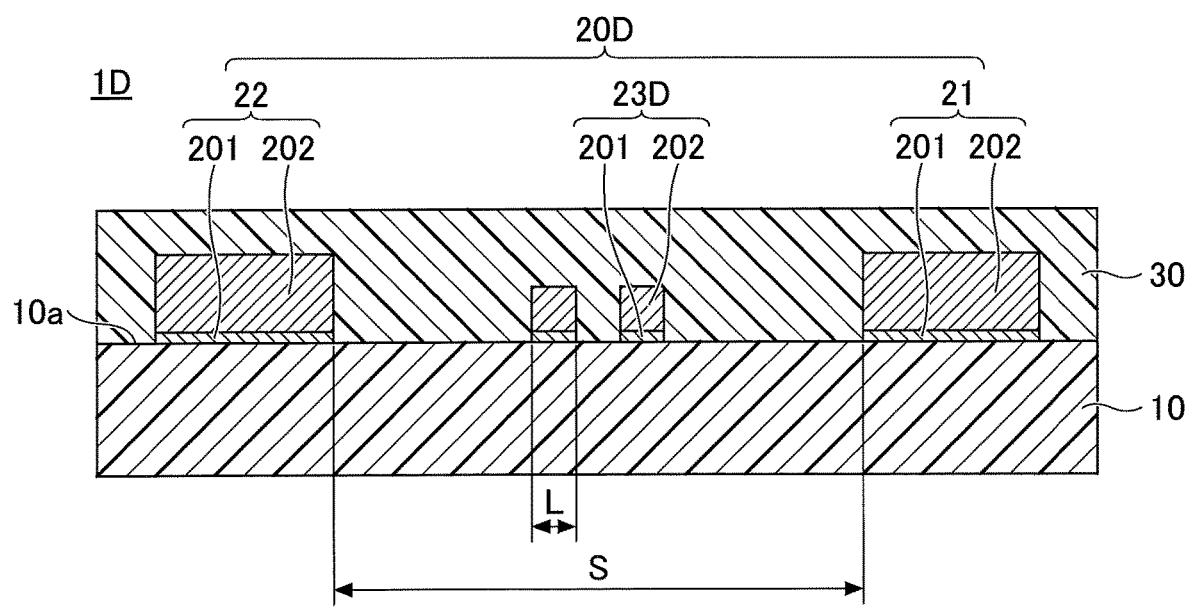

FIGS. 11A and 11B are diagrams illustrating an example of a wiring substrate 1D according to variation example 4 of the first embodiment. FIG. 11A is a partial plan view of the wiring substrate 1D, and FIG. 11B is a cross-sectional view of the wiring substrate 1D taken along the line A-A of FIG. 11A. Note that in FIG. 11A, the wiring patterns 21 and 22 and a dummy pattern 23D are illustrated by pear-skin patterns for convenience of description. Also, in FIG. 11A, illustration of the insulating layer 30 that is illustrated in FIG. 11B is omitted.

With reference to FIGS. 11A and 11B, the wiring substrate 1D is different from the wiring substrate 1 (see FIG. 1 and the like) in that the wiring layer 20 is replaced with a wiring layer 20D including the wiring patterns 21 and 22 and the dummy pattern 23D.

According to variation example 4 of the first embodiment, for example, the dummy pattern 23D is a pattern in which a plurality of cylindrical dots are arranged in two lines at the center portion between the nearby wiring patterns 21 and 22.

Similarly to the first embodiment, L can be in a range of approximately 2.5% to approximately 5% of the space S (wiring space) between the side surfaces of the wiring pattern 21 and the wiring pattern 22 facing each other. For example, when the space S is 400 µm, L can be in a range of approximately 10 µm to approximately 20 µm.

Similarly to the first embodiment, the heights of the respective cylindrical dots constituting the dummy pattern 23D are lower than the heights of the nearby wiring patterns 21 and 22. The heights of the wiring patterns 21 and 22 can be, for example, in a range of approximately 10 µm to approximately 20 µm. The heights of the respective cylindrical dots constituting the dummy pattern 23D can be, for example, approximately half of the heights of the wiring patterns 21 and 22.

In this manner, arranging the dots constituting the dummy pattern 23D in two lines makes it easy to deal with downward deformation of the resin film 300. That is, even when the resin film 300 deforms downward toward any part, the possibility that any of the dots receive the downward deformation of the resin film 300 can be enhanced.

Note that the effects described above can be obtained when the dots constituting the dummy pattern 23D are arranged in a plurality of lines. Therefore, the dots constituting the dummy pattern 23D may be in three or more lines (however, the dots are required to be arranged in a range that does not hinder a resin filling property and electromigration resistance).

Also, the effects described above can be obtained when the dots constituting the dummy pattern 23D are arranged in a plurality of lines. Therefore, the shapes of the dots constituting the dummy pattern 23C are not limited to cylindrical shapes, and can be shapes as desired.

Although the preferred embodiment and the variation examples have been described above in detail, the present invention is not limited to the embodiment and the variation examples described above, and various variations and substitutions may be made for the embodiment and the variation examples described above without departing from the scope of the present invention.

For example, although a wiring substrate having two insulating layers and one wiring layer is exemplified for each of the first embodiment and the variation examples, the wiring substrate is not limited to having two insulating layers and one wiring layer. The present invention can also be applied to any wiring substrate in which an insulating layer made of resin that covers nearby wiring patterns is formed by lamination, and the number of insulating layers or wiring layers may be any desired number.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A wiring substrate comprising:
    a first insulating layer;
    a plurality of wiring patterns formed on one surface of the first insulating layer;
    a dummy pattern formed, on the one surface of the first insulating layer, between nearby wiring patterns; and
    a second insulating layer made of resin and formed on the one surface of the first insulating layer so as to cover the nearby wiring patterns and the dummy pattern, wherein the dummy pattern is a dot pattern arranged at a center portion between the nearby wiring patterns, wherein a height of at least one dot constituting the dummy pattern is lower than heights of the nearby wiring patterns, wherein the center portion is an area, with respect to a center line passing through a center between side surfaces of the nearby wiring patterns, within ±2 L in directions towards the side surfaces of the nearby wiring patterns in plan view where L is a diameter of the at least one dot in plan view, wherein the dummy pattern is arranged only within the center portion, wherein the nearby wiring patterns and the dummy pattern protrude from the one surface in a thickness direction of the wiring substrate, and wherein between the nearby wiring patterns and on the one surface, only the dummy pattern is arranged within the center portion and no other patterns are arranged.

2. The wiring substrate according to claim 1, wherein the at least one dot has an inclined side surface that widens toward the one surface of the first insulating layer.

3. The wiring substrate according to claim 1, wherein the dummy pattern includes a plurality of dots arranged in a zigzag manner.

4. The wiring substrate according to claim 1, wherein the dummy pattern includes a plurality of dots arranged in a plurality of lines.

5. The wiring substrate according to claim 1, wherein the at least one dot has an elliptical shape in a plan view, and a long side of the elliptical shape is arranged along a forming direction of the wiring patterns.

* * * * *